(12) United States Patent
Chiu et al.

(10) Patent No.: US 9,326,374 B2
(45) Date of Patent: Apr. 26, 2016

(54) FLEXIBLE CIRCUIT BOARD AND PROCESS FOR PRODUCING THE SAME

(71) Applicant: ICHIA TECHNOLOGIES,INC., Taoyuan County (TW)

(72) Inventors: Chien-Hwa Chiu, Taoyuan County (TW); Chih-Min Chao, Taoyuan County (TW); Peir-Rong Kuo, Taoyuan County (TW); Chia-Hua Chiang, Taoyuan County (TW); Chih-Cheng Hsiao, Taoyuan County (TW); Feng-Ping Kuan, Taoyuan County (TW); Ying-Wei Lee, Taoyuan County (TW); Yung-Chang Juang, Taoyuan County (TW)

(73) Assignee: ICHIA TECHNOLOGIES, INC., Taoyuan (TW)

( * ) Notice: Subject to any disclaimer, the term of this patent is extended or adjusted under 35 U.S.C. 154(b) by 147 days.

(21) Appl. No.: 13/967,401

(22) Filed: Aug. 15, 2013

(65) Prior Publication Data

US 2014/0224527 A1  Aug. 14, 2014

(30) Foreign Application Priority Data

Feb. 8, 2013  (TW) .............................. 102105372 A

(51) Int. Cl.
*H05K 1/02* (2006.01)
*H05K 3/00* (2006.01)
*H05K 3/20* (2006.01)
(Continued)

(52) U.S. Cl.
CPC .................. *H05K 1/028* (2013.01); *H05K 3/20* (2013.01); *H05K 3/22* (2013.01); *H05K 3/386* (2013.01); *H05K 3/465* (2013.01); *H05K 3/4673* (2013.01); *H05K 1/0393* (2013.01); *H05K 3/426* (2013.01); *H05K 2201/0154* (2013.01);
(Continued)

(58) Field of Classification Search
CPC ... H05K 1/0271; H05K 3/0082; H05K 1/028; H05K 3/20; H05K 3/22; H05K 3/386; H05K 3/485; H05K 3/4673
USPC ............................ 174/251; 430/315; 428/161
See application file for complete search history.

(56) References Cited

U.S. PATENT DOCUMENTS 3,892,635 A * 7/1975 Mallico ......................... 205/118
4,508,766 A * 4/1985 Inaike et al. ................. 427/99.4
(Continued)

FOREIGN PATENT DOCUMENTS

JP      S 53100468      9/1978
JP      S6247187 A      2/1987
(Continued)

*Primary Examiner* — Timothy Thompson
*Assistant Examiner* — Charles Pizzuto
(74) *Attorney, Agent, or Firm* — Li & Cai Intellectual Property (USA) Office

(57) ABSTRACT

A flexible circuit board comprises a substrate which has a polyimide layer recessed to define at least a compartment. The compartment includes an inner wall surface having a side wall and a bottom wall. The compartment is for containing a multilayer unit, wherein the multilayer unit includes an adhesion enhancing layer formed on the wall of the compartment, a first electrically conducting layer disposed on the adhesion enhancing layer, and a second electrically conducting layer formed on the first electrically conducting layer. The adhesion enhancing layer is palladium. The first electrically conducting layer is nickel. The substrate is composed of polyimide (PI).

15 Claims, 8 Drawing Sheets

(51) Int. Cl.
  *H05K 3/22* (2006.01)
  *H05K 3/38* (2006.01)
  *H05K 3/46* (2006.01)
  *H05K 1/03* (2006.01)
  *H05K 3/42* (2006.01)

(52) U.S. Cl.
  CPC ..... *Y10T 428/24521* (2015.01); *Y10T 428/265* (2015.01); *Y10T 428/31678* (2015.04)

(56) References Cited

U.S. PATENT DOCUMENTS

| | | | |
|---|---|---|---|
| 5,133,840 A * | 7/1992 | Buchwalter et al. | 205/167 |
| 5,281,690 A * | 1/1994 | Flaim et al. | 528/353 |
| 5,507,903 A * | 4/1996 | Yamamori et al. | 156/229 |
| 6,242,078 B1 * | 6/2001 | Pommer et al. | 428/209 |
| 6,444,921 B1 * | 9/2002 | Wang et al. | 174/260 |
| 6,577,011 B1 * | 6/2003 | Buchwalter et al. | 257/758 |
| 2007/0026678 A1 * | 2/2007 | Sakayori et al. | 438/689 |
| 2008/0052904 A1 * | 3/2008 | Schneider et al. | 29/846 |
| 2008/0118730 A1 * | 5/2008 | Yu et al. | 428/220 |
| 2010/0291371 A1 * | 11/2010 | Kanakarajan et al. | 428/323 |
| 2012/0168944 A1 * | 7/2012 | Gan et al. | 257/738 |
| 2012/0183793 A1 * | 7/2012 | John et al. | 428/472.2 |
| 2014/0011905 A1 * | 1/2014 | Kyung et al. | 522/164 |
| 2014/0030425 A1 * | 1/2014 | Owei et al. | 427/97.1 |

FOREIGN PATENT DOCUMENTS

| | | | |
|---|---|---|---|
| JP | 05-235545 A | | 9/1993 |
| JP | H10190192 A | | 7/1998 |
| JP | 2001217552 | * | 8/2001 |
| JP | 2005-029735 A | | 2/2005 |
| JP | 2006247849 A | | 9/2006 |
| JP | 2007088288 A | | 4/2007 |

* cited by examiner

FLEXIBLE CIRCUIT BOARD AND PROCESS FOR PRODUCING THE SAME

BACKGROUND OF THE INVENTION

1. Field of the Invention

The present disclosure relates to a flexible circuit board and a process for producing the same; in particular, to a flexible circuit board formed with a coating-facilitating adhesion enhancing layer on each of the two sides of a compartment having an electric circuit, and a process of producing the flexible circuit board.

2. Description of Related Art

Conventional flexible circuit boards are made by processing precursor substrates. The precursor substrates must be coated with a metal conducting layer to enable subsequent processing. Metals generally do not easily adhere to conventional precursor substrates. Conventional methods of coating metal include metal spraying, sputtering deposition, CVD, vapor deposition, and dry coating. However these methods result in problems of thick precursor substrates, or difficult and overly long coating processes. Excess thickness compromises the miniaturization of products. Difficult and overly long coating processes result in limited production capacity and raised production cost.

The above conventional methods not only cannot overcome problem of necking, but given that the technical and material resources of the precursor substrates are controlled by upstream manufacturers, products that use these precursor substrates are subject to charges by external parties and, due to inability to improve the properties of these products, a fundamental solution for reducing cost is unattainable.

Moreover, in order to form electric circuits on the precursor substrate, an adhesion enhancing metal layer, e.g. nickel, is generally coated on the precursor substrate. Copper is then integrated with the nickel by selectively using a photoresist. Next, large amount of etching is required to remove the copper and nickel that are not part of the electric circuit on the precursor substrate. This method creates large amount of wasted copper and nickel, increasing the cost. In addition to increased cost, the distribution (coverage) of the adhesion enhancing nickel on the substrate is limited, such that improvement upon stable adhesion of the electric circuit is limited, thereby compromising product quality. Portions between the electric circuit and the substrate are not enhanced by the metal adhesion enhancing layer. Different thermal expansion coefficients between the metal and the substrate may create gaps or other structural disintegration in the electric circuit when the ambience temperature changes, thus, affecting the transmission quality and life span of the product. This problem is especially prominent in multi-layered flexible printed circuit boards.

Hence, the present inventor believes the above mentioned disadvantages can be overcome, and through devoted research combined with application of theory, finally proposes the present disclosure which has a reasonable design and effectively improves upon the above mentioned disadvantages.

SUMMARY OF THE INVENTION

The object of the present disclosure is to provide a flexible circuit board and a process for producing the same, so as to reduce the thickness of the product, save production time and cost, thereby taking advantage of the properties and value of the product.

In order to achieve the aforementioned objects, the present disclosure provides a process for producing a flexible circuit board including the following steps: providing a substrate having an upper surface and a lower surface; forming a polyamic acid layer on the surface of the substrate and conducting a first pre-curing process on the polyamic acid layer such that the polyamic acid layer is semi-cured; coating photoresist layer on the polyamic acid layer and conducting a second pre-curing process on the photoresist layer and the polyamic acid layer; exposing and developing the photoresist according to a circuit configuration diagram to partially remove the photoresist and the polyamic acid layer thereunder, and partially revealing the surface of the substrate while leaving the remaining photoresist and the remaining polyamic acid thereunder, defining a compartment having an inner wall surface which includes a side wall and a bottom wall; using an adhesion enhancer to adhesively enhance the side wall and the bottom wall; forming a first electrical conducting layer integrated with the adhesion enhancing layer, thereby fixing the first electrical conducting layer on the side wall and the bottom wall; removing the remaining photoresist to reveal the polyamic acid underneath; curing the remaining polyamic acid which becomes polyimide, thereby forming a precursor substrate; electroplating a second electrically conducting layer on the surface of the precursor substrate, selectively forming an electric circuit with the first electrically conducting layer and the adhesion enhancing layer in the compartment of the precursor substrate; and forming an electrically insulating layer for covering the electric circuit and the polyimide on the surface of the precursor substrate.

In order to achieve the aforementioned objects, the present disclosure provides a flexible circuit board, including: a substrate whose surface is formed with a polyimide layer, wherein the polyimide layer is depressed and defines at least one compartment, the compartment has an inner wall surface having a side wall and a bottom wall, the compartment accommodates a multilayer unit including an adhesion enhancing layer positioned on at least the inner wall surface of the compartment; a first electrically conducting layer disposed on the adhesion enhancing layer; and a second electrically conducting layer formed on the first electrically conducting layer; wherein the adhesion enhancing layer on the side wall sequentially forms with the first electrically conducting layer and the second electrically conducting layer a successively laterally layered structure, and the multilayer unit forms an electric circuit.

In order to achieve the aforementioned objects, the present disclosure provides a precursor substrate, including: a substrate whose surface is formed with a polyimide layer, wherein the polyimide layer is depressed and defines at least one compartment, the compartment has an inner wall surface having a side wall and a bottom wall, the compartment accommodates a multilayer unit including an adhesion enhancing layer positioned on at least the inner wall surface of the compartment; and a first electrically conducting layer disposed on the adhesion enhancing layer.

In summary, relative to conventional methods, the present disclosure coats polyamic acid and photoresist first instead of a metal layer for assisting electroplating. A compartment is formed by exposure and developing for accommodating the intended electric circuit, saving the step of large amount of etching and the waste of the associated material and cost. Additionally, the present disclosure uses the adhesion enhancing layer as an adhesive medium between the first electrically conducting layer and the substrate, which corresponds to a relatively unique electroless plating, thusly providing a preferable adhesive effect between the first electrically conducting layer and the substrate. The distribution and coverage of the first electrically conducting layer on the substrate is higher, such that the electric circuit is more stably integrated to the substrate. Compared to conventional techniques, the present method reduces the thickness of the first electrically conducting layer and the time required for coating, thereby achieving an aim of reduced thickness and reduced cost, and the advantage of controlling source of materials.

In order to further the understanding regarding the present invention, the following embodiments are provided along with illustrations to facilitate the disclosure of the present invention.

DETAILED DESCRIPTION OF THE PREFERRED EMBODIMENTS

Figure 1:
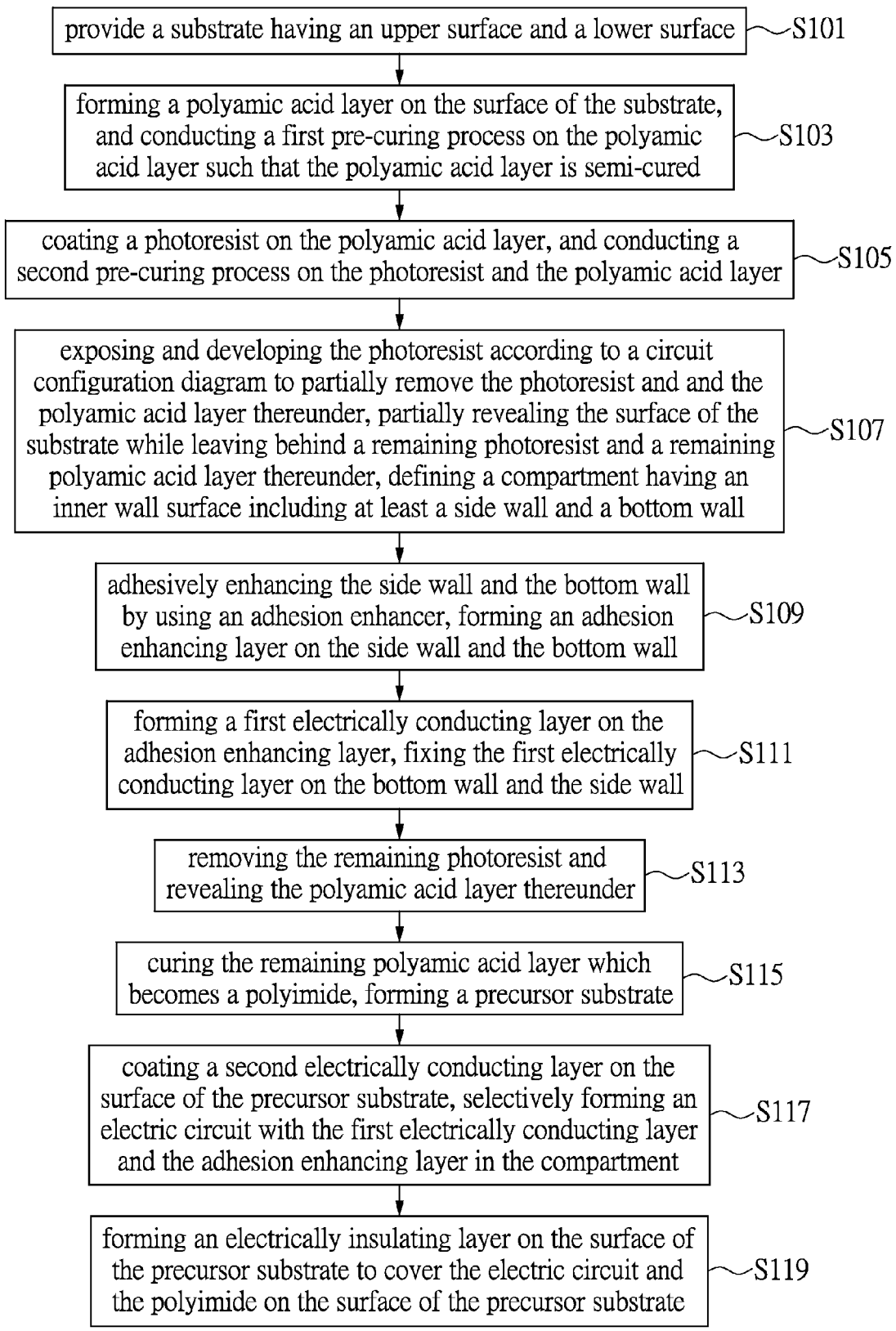
FIG. 1 shows a flowchart of a method of producing a flexible circuit board according to the present disclosure.

The aforementioned illustrations and following detailed descriptions are exemplary for the purpose of further explaining the scope of the present disclosure. Other objectives and advantages related to the present disclosure will be illustrated in the subsequent descriptions and appended drawings. FIG. 1, FIG. 2A, FIG. 2B and FIG. 2C show a flowchart of a method of producing a flexible circuit board according to the present disclosure and cross-sectional views corresponding to the steps of the method of producing a flexible circuit board according to the present disclosure. The present disclosure provides a method of manufacturing a flexible circuit board, including the following steps:

Provide a substrate 10 having a surface 11. The surface 11 includes an upper surface 111 and a lower surface 112 (step S101). The substrate 10 is made of raw material such as Polyimide (PI), Polyethylene Terephthalate Polyester (PET), Polyethylene Naphthalate (PEN), Polytetrafluorethylene (PTFE), Thermotropic Liquid Crystal Polymer (LCP), Epoxy, Aramid, and other macro polymers. The following embodiments of the substrate 10 is made of polyimide, which is a preferred material Form a polyamic acid layer PAA on the surface 11 of the substrate 10. The surface 11 includes an upper surface 111 and a lower surface 112; however the labels in the figures mainly describe the upper surface 111 of the surface 11, and the portions of the lower surface 112 are inferred analogously. To facilitate expression, the abbreviation for polyamic acid, PAA, is used for labeling the polyamic acid layer.

Next, conduct a first pre-curing process on the polyamic acid layer PAA, preferably at 280 to 350 degrees Celsius or higher, such that the polyamic acid layer PAA is semi-cured (step S103). The semi-cured polyamic acid changes from an originally low-viscosity fluid to a to a high-viscosity gel, such that other materials can be successfully laid and stacked on the polyamic acid layer PAA in a well-supported manner.

Lay a photoresist layer PR on the polyamic acid layer PAA, and conduct a second pre-curing process on the polyamic acid layer PAA and the photoresist layer PR (step 105), preferably between 75 to 110 degrees Celsius, thereby creating a preferable adhesion between the photoresist PR and the polyamic acid layer PAA thereunder. Additionally, the type of photoresist PR is not limited and can be a positive photoresist or a negative photoresist. The photoresist 40 can be laid by lamination or coating.

Figure 2A:
FIG. 2A to FIG. 2H are cross-sectional views corresponding to the steps of the method of producing a flexible circuit board according to the present disclosure.
Figure 2B:
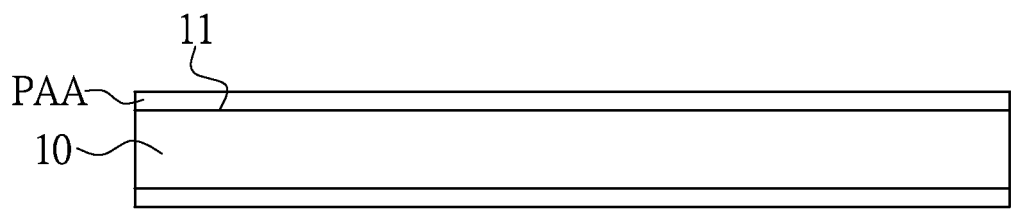
Figure 2C:
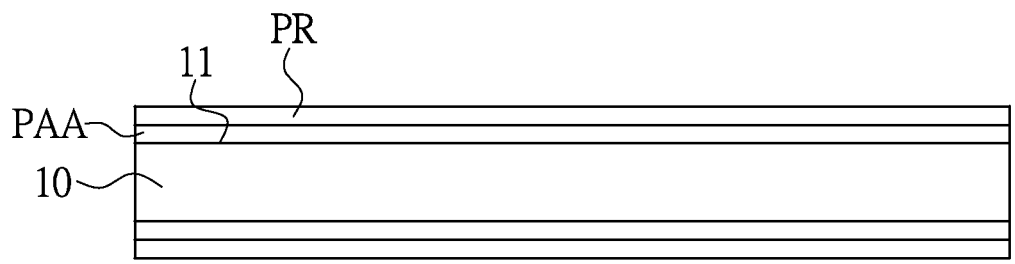
Figure 2D:
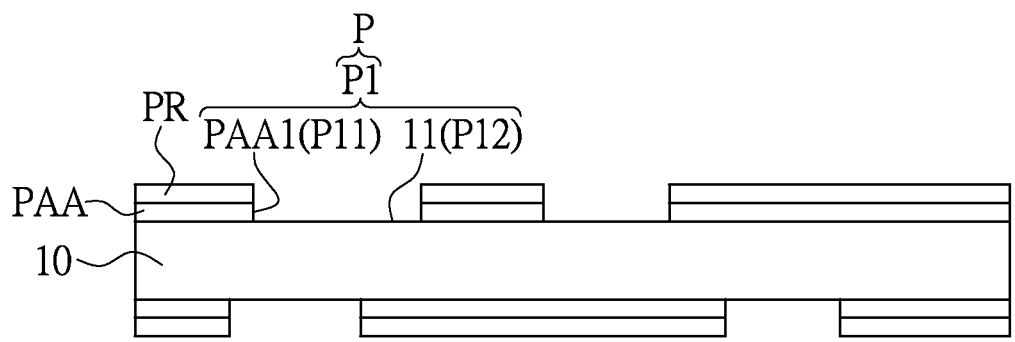
Figure 2E:
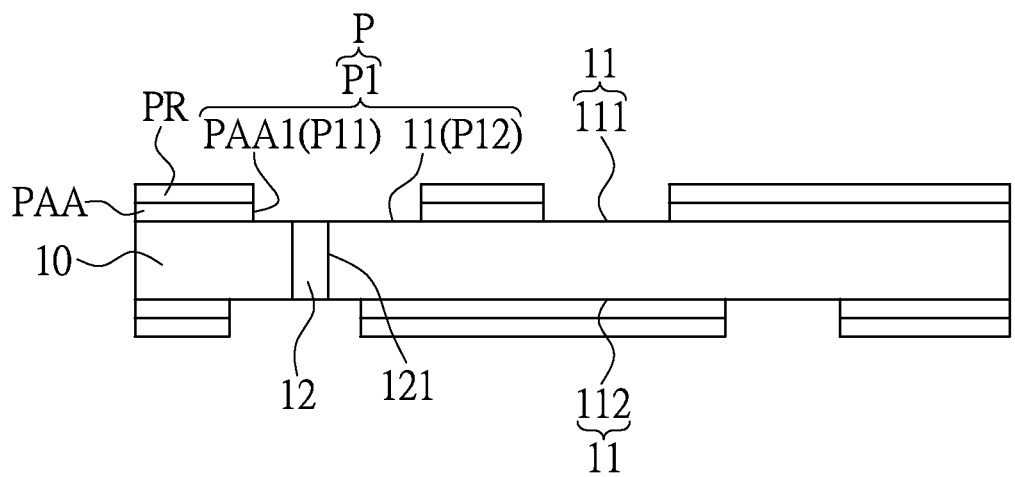

Referring to FIGS. 1, 2D and 2E, carrying out the above-mentioned production method, the photoresist PR is exposed and developed by a developing solution according to a circuit configuration diagram so as to partially remove the photoresist PR and the polyamic acid layer PAA thereunder, partially reveal the surface 11 of the substrate, and leave the remaining photoresist PR and the remaining polyamic acid layer PAA thereunder, jointly defining a compartment P (step S107). The developing solution used in the exposure and developing step can be a solution selected from the group consisting of tetramethylammonium hydroxide (TMAH) and sodium carbonate ($Na_2CO_3$). The developing solution containing tetramethylammonium hydroxide has a pH value of 11-13 and contains 2.38% tetramethylammonium hydroxide by mass. The developing solution containing sodium carbonate has a pH value of 9-11 and contains 2.1% sodium carbonate by mass. The compartment has an inner wall surface P1 including at least a side wall P11 and a bottom wall P12. The side PAA1 of the polyamic acid layer PAA defines the side wall P11. The revealed surface 11 of the substrate 10 defines the bottom wall P12.

Figure 2F:
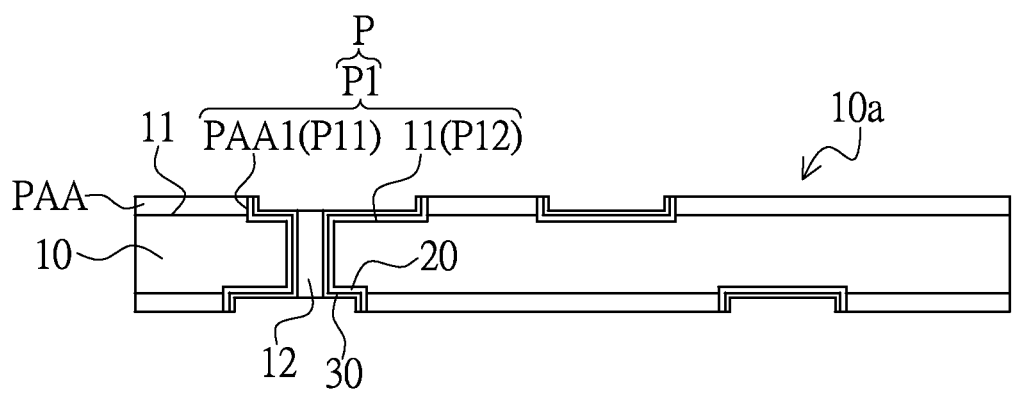
Figure 2G:
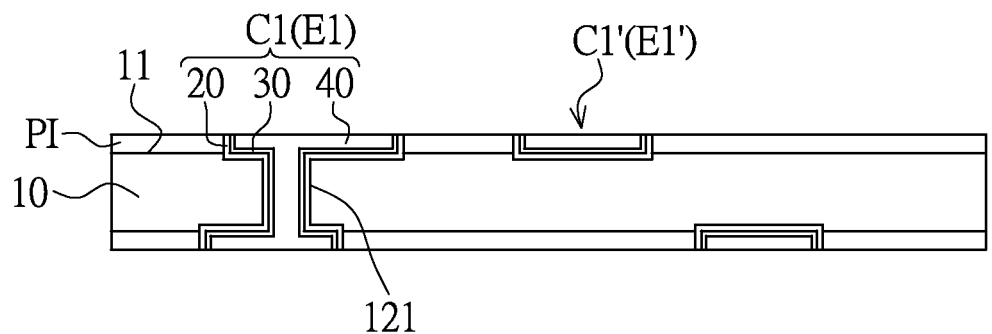

Referring to FIG. 2E, step S108 (not shown in FIG. 1) can be included after step S107 depending on need. In step S108, laser processing can be applied to bore a via hole 12 on the bottom wall P12 connecting the upper surface 111 and the lower surface 112. The via hole 12 can connect the compartment P on the upper surface 111 and the compartment P on the lower surface 112. The via hole 12 has a tunnel wall 121. Referring to FIG. 2F and FIG. 2G, the bottom wall P12 is connected to the tunnel wall 121, the compartment P is connected to the via hole 12, by which configuration the electric circuit E1 of the compartment P on the upper surface 111 can further extend to the tunnel wall 121 and electrically connect to the electric circuit of the compartment P on the lower surface 112 (label omitted). The substrate 10 or the bottom wall P12, which has been worked on by laser, can also be cleaned with plasma to remove residues left behind by laser processing.

After step S108, refer to FIGS. 1, 2E and 2F. FIG. 2F shows the resulting product after carrying out steps S109, S111 and S113. If the via hole 12 exists, use an adhesion enhancer to adhesively enhance the side wall P11 and the bottom wall P12 of the compartment P and the tunnel wall 121, forming an adhesion enhancing layer 20 (step S109). Preferably, the adhesion enhancer is a palladium (Pd) adhesion enhancer. Then, form a first electrical conducting layer 30 which is chemically bonded to the adhesion enhancing layer 20. With the assistance of the adhesion enhancing layer 20, the first electrical conducting layer 30 is fixed onto the bottom wall P12, the side wall P11 and the tunnel wall 121 (S111). However, if the via hole 12 does not exist, then the adhesion enhancing layer 20 and the first electrically conducting layer 30 are not formed on the via hole 121. Preferably, the first electrical conducting layer 30 has a thickness between 50 nanometers and 5000 nanometers, and is made of one material selected from the group consisting of copper, nickel, chromium, cobalt, nickel alloy, or cobalt alloy. Since the first electrical conducting layer 30 is fixed onto the side wall P11, the bottom wall P12 and possibly the tunnel wall 121 by electroless plating, it is a type of electroless plating layer.

It is worth mentioning that in the method provided by the present disclosure, the photoresist PR exists before the adhesion enhancing layer 20 and the first electrically conducting layer 30 are formed, and is exposed and developed according to the aforementioned circuit configuration diagram to form from the compartment P. Therefore, the configuration of the electric circuit is already completed by the formation of the compartment P, the electric circuit can be formed on the substrate 10 with more options and efficiency, and the adhesion enhancing layer 20 and the first electrically conducting layer 30 do not need to be coated on the entire substrate 10 because the electric circuits are already defined by the compartment P. Good selectivity is achieved and material cost is saved.

After step S111, referring to FIG. 2F, remove the remaining photoresist to reveal the polyamic acid layer thereunder (step S113). Then, as shown in FIGS. 2F and 2G which includes steps S115 and S117, cure the remaining polyamic acid layer PAA such that it hardens on the surface 11 of the substrate 10, such that the polyamic acid layer disposed around the compartment P changes into a polyimide layer PI, thereby forming a precursor substrate 10a (step S115). Directly coat a second electrically conducting layer 40 on the precursor substrate 10a by electroplating. The polyimide layer PI itself cannot be directly electroplated, so the second electrically conducting layer 40 can be selectively electroplated only in the compartment P of the precursor substrate 10a, forming an electric circuit (E1 or E1') (step S117) according to the circuit configuration diagram. As an example, the electric circuit E1 includes an adhesion enhancing layer 20, a first electrical conducting layer 30 and a second electrically conducting layer 40. The adhesion enhancing layer 20 on the side wall P11 sequentially forms with the first electrically conducting layer 30 and the second electrically conducting layer 40 from the side wall P11 toward the compartment P a successively laterally layered structure. Preferably, the polyamic acid PAA is cured into a polyimide layer PI at a temperature above 290 degrees Celsius, in an environment with high density of nitrogen, and under infrared lighting.

Figure 2H:
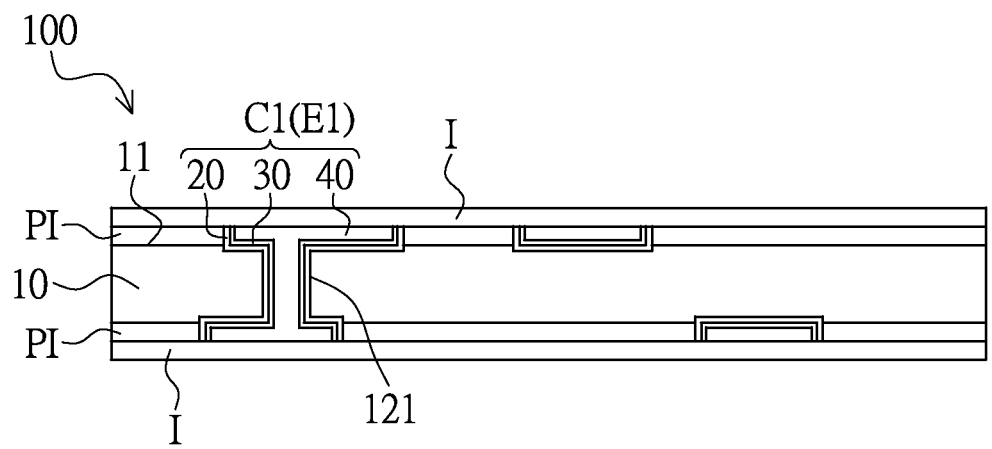

Lastly, referring to FIG. 2H, an electrically insulating layer I is formed at the surface of the precursor substrate 10a (step S119), thereby covering the electric circuit E1 and the polyimide layer PI on the precursor substrate 10a. Preferably, the electrical insulation layer I is a material selected from the group consisting of polyimide film, polyamic acid (PAA), polyethylene terephthalate, polyethylene, liquid crystal polymer, epoxy resin, polyphenylene sulfide and photosensitive cover film. Specifically, the surface of the precursor substrate 10a includes the first electrically conducting layer 30 in the compartment P and the cured polyimide layer PI relatively higher than the first electrically conducting layer 30 or the compartment P and the electroplated second electrically conducting layer 40 is a metal layer, preferably a typical conducting material such as copper (Cu) but not limited thereto.

Figure 3A:
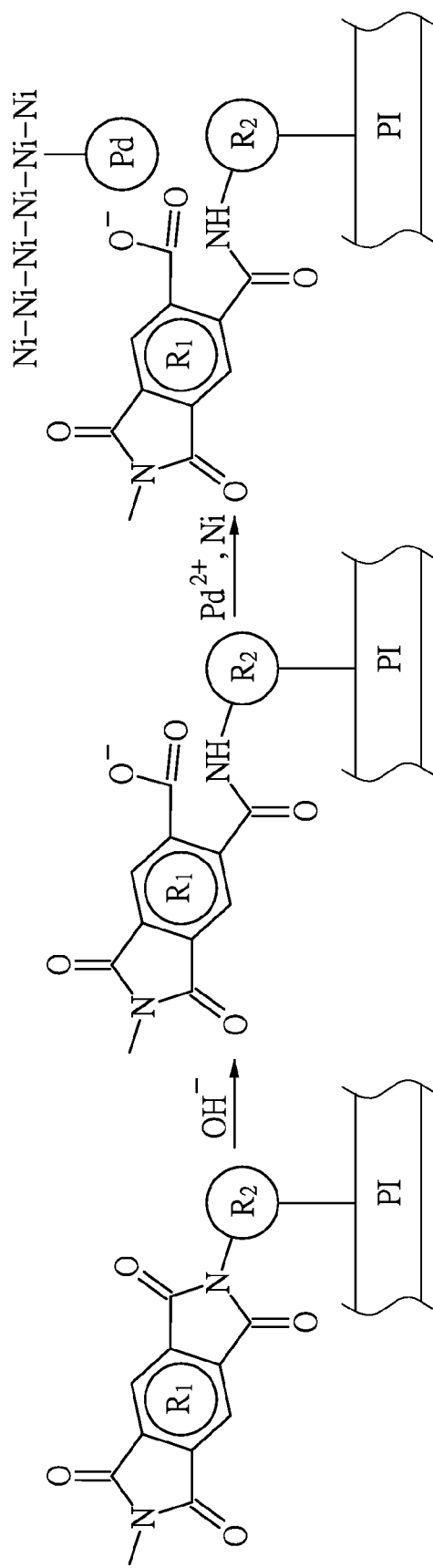
FIG. 3A shows a schematic diagram of a chemical mechanism employed during conductivity treatment according to the present disclosure.

Referring to FIG. 2H, the substrate 10, the adhesion enhancing layer 20 and the first electrically conducting layer 30 are respectively embodied by polyimide, palladium, and nickel, but are not limited thereto. Referring to FIGS. 1 and 3A, in step S109, a conductivity treatment is included. The object is to enhance the adhesion between the surface 11 of the substrate 10 and the palladium adhesion enhancer. The first electrical conducting layer 30 is formed on the surface 11 of the substrate 10 by disposing the nickel on the palladium adhesion enhancer, which serves an important role as a foundation for the nickel to adhere to the substrate 10. In other words, the nickel of the first electrical conducting layer 30 and the palladium of the adhesion enhancing layer can form a palladium-nickel alloy.

Figure 3B:
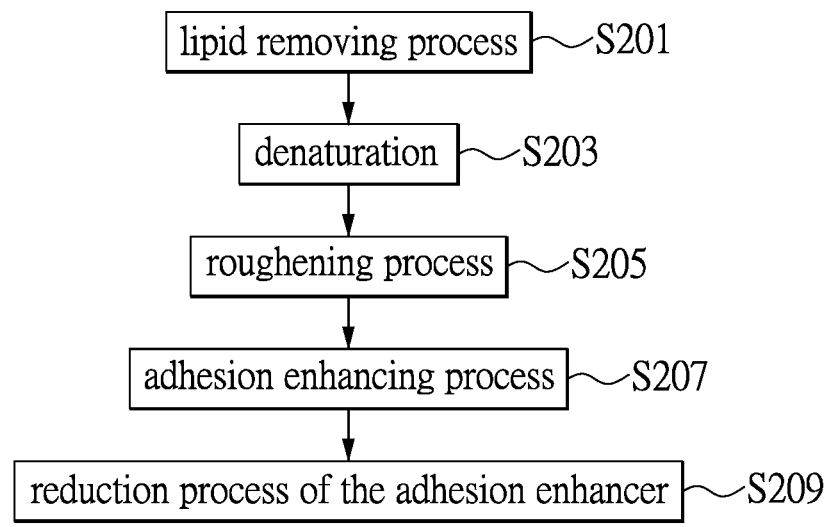
FIG. 3B shows a flowchart of steps of the conductivity treatment according to the present disclosure.

Referring to FIGS. 2F, 3A and 3B, in order to enhance the adhesion between the inner wall surface P1 of the compartment (e.g. the bottom wall P12, the side wall P11 or the tunnel wall 121) and the palladium adhesion enhancer, the conductivity treatment can conduct the following steps on the inner wall surface P1 and the tunnel wall 121: lipid removing process (step S201), denaturation (step S203), roughening process (step S205), adhesion enhancing process (step S207), and reduction process of the adhesion enhancer (step S209). Conductivity treatment on the inner wall surface P1 made of polyimide (PI) is described below, and the conductivity treatment of the tunnel wall 121 is analogous. In particular, the roughening process (step S205) of the inner wall surface P1 includes chemical roughening or physical roughening. The chemical roughening includes using chemical agent on the surface of the inner wall surface P1 to roughen by corrosion or ring-opening reactions. The physical roughening includes roughening the surface of the inner wall surface P1 by mechanical means. Both methods improve adhesion of the surface of the inner wall surface P1 to the palladium adhesion enhancer. The method of ring-opening reaction opens the molecular rings of the material of the inner wall surface P1 of the substrate 10 to create unevenness in the molecular structure, to enhance adhesion between the palladium adhesion enhancer and the inner wall surface P1. In other words, if ring opening occurs on the structure of polyimide for example, microscopically the inner wall surface P1 is roughened, thereby creating an adhesion effect between the surface of the inner wall surface P1 of the substrate 10 and the ions of the palladium adhesion enhancer, such that the ions of the palladium adhesion enhancer is easily attached onto the inner wall surface P1, forming the adhesion enhancing layer 20.

Furthermore, as shown in FIG. 3B, roughening by chemical ring opening involves using a basic agent to cleave one of the carbon-nitrogen bond of imides (O=C—N—C=O) such that ring opening occurs in the polyimide layer PI, and then using the palladium adhesion enhancer as a medium to increase adhesion between the polyimide and nickel, completing the process of electroless plating. However, as shown in FIG. 2E, the inner wall surface P1 also includes the side wall P11 whose composition includes polyamic acid which is incompletely cured. Since the polyamic acid is a polyimide not yet cyclized, the side wall P11 can logically be treated by the conductivity treatment and palladium can adhere to the side wall P11 even better because no ring-opening is required.

Referring to FIG. 3B in conjunction with FIGS. 2E and 2F, when using ring-opening as the roughening method, the following applies in the conductivity process:

The lipid removing process uses amino alcohol ($H_2NCH_2CH_2CH_2OH$, agent number ES-100) agent having pH between 10 and 11 and temperature between 45 and 55 degree Celsius to clean the surface 11 of the substrate 10 for 1 to 3 minutes, in order to remove lipid.

The surface denaturation process uses a weak base having pH between 7.5 and 8.5 and temperature between 35 and 45 degree Celsius, such as sodium carbonate (agent number ES-FE) to clean the inner wall surface P1 of the surface 11 of the substrate 10 for 1 to 3 minutes, in order to restore the usual pH value on the surface of the substrate 10 and the inner wall surface P1 and to remove residual ES-100. However, depending on the conditions after the previous steps, the present step can be skipped accordingly to achieve a more preferable effect.

The surface roughening process is a chemical process which uses an inorganic base having pH between 11 and 12 and temperature between 45 and 55 degree Celsius, such as potassium hydroxide (KOH, agent number ES-200) but is not limited hereto, in order to perform basic denaturation on the inner wall surface P1 for 1 to 3 minutes, such that one of the carbon-nitrogen bonds in the polyimide O=C—N—C=O is cleaved and ring opening occurs to the polyimide.

The adhesion enhancing process includes: using an adhesion enhancer to attach onto the surface of the inner wall surface P1 to form an adhesion enhancing layer 20. More specifically, the present step involves palladium ions forming chemical bonds with the carbonyl group (O=C—O—) of open ring polyimide (using agent ES-300 includes complex compound having palladium sulfate $H_2SO_4.Pd_4$, of a pH between 5.5 and 6.5, and a temperature between 45 and 55 degree Celsius for 1 to 4 minutes).

The reduction process of the adhesion enhancer includes adhering a metal onto the adhesion enhancing layer 20, thereby merging the first electrical conducting layer 30 with the surface of the substrate 10. More specifically, the present process uses agent ES-400 whose main ingredient is boron (pH is between 6 and 8, the temperature is between 30 and 40 degree Celsius, the process time is between 1 to 3 minutes), to reduce palladium ions such that the palladium can adhere to metal (nickel). Next use agent ES-500 whose main ingredients are $NiSO_4.6H_2O$ and $NaH_2PO_2$ (pH is between 8 and 9, temperature is between 35 and 45, processing time is between 3 and 5 minutes). The nickel easily adheres to the surface of the substrate 10 with the palladium adhesion enhancer acting as an intermediary bonding medium. The nickel layer (first electrically conducting layer) has a thickness of 50 to 200 nanometers. After processing of the ES-500, the precipitated electroless plating nickel has a low amount of phosphorus (2-3%), therefore, the first electrically conducting layer 30 is more ductile. The precipitation speed is about 100 nm/5 minutes, which is relatively faster than the conventional method, thereby saving production time and cost.

As an aside, in the figures of the present disclosure, the adhesion enhancing layer 20, the first electrically conducting layer 30, the top surface 111, the lower surface 112, and the tunnel wall 121 have clear boundaries delineated in the diagrams merely for schematic purposes. In practice, the adhesion between the first electrically conducting layer 30 or the adhesion enhancing layer 20 to the top surface 111, the lower surface 112 or the inner wall 121 can include an integrated merging layer (omitted in the figures). This implies that the flexible circuit board produced by the production method of the present disclosure has strong adhesion between the surface 11 (such as the bottom wall P12) or the side wall P11, and the adhesion enhancing layer 20 and the first electrically conducting layer 30.

Referring to FIGS. 2G and 2H and according to the aforementioned production method, the present disclosure provides a flexible circuit board including a substrate 10, a photoresist PR and a polyamic acid layer PAA formed on the surface 11 of the substrate 10, exposed, developed, and cured to form a recessed polyimide layer PI defining a compartment P. In other words, the compartment P is defined after the photoresist PR and the polyamic acid layer PAA have been exposed, developed and partially removed. After removing the remaining photoresist PR and curing the polyamic acid layer, a polyimide layer PI is formed. Therefore, the compartment P can be more definitely described as being defined by the remaining polyimide layer PI.

The compartment P has an inner wall surface P1 including a side wall P11 and a bottom wall P12. The compartment P accommodates a multilayer unit C1 including an adhesion enhancing layer 20, a first electrically conducting layer 30 and a second electrically conducting layer 40. The adhesion enhancing layer preferably includes a palladium adhesion enhancer, and is disposed at least on the inner wall surface P1 of the compartment P. The first electrically conducting layer 30 adheres to the adhesion enhancing layer 20. The second electrically conducting layer 40 is formed on the first electrically conducting layer 30. The adhesion enhancing layer 20 on the side wall P11 sequentially forms with the first electrically conducting layer 30 and the second electrically conducting layer 40 from the side wall P11 a successively laterally layered structure. The multilayer unit C1 forms an electric circuit E1. Therefore, not only does the structure of the multilayer unit C1 of the present disclosure have an adhesion enhancing layer 20, a first electrically conducting layer 30 and a second electrically conducting layer 40 extending from the bottom wall P12, but also an adhesion enhancing layer 20, a first electrically conducting layer 30 and a second electrically conducting layer 40 extending from the side wall P11 to form a successively laterally layered structure. Therefore, the two sides of the multi-layered unit C1 of the compartment P has the adhesion enhancing layer 20 and the first electrically conducting layer 30 which assist electroplating. Therefore, the multilayer unit C1 provides excess and more preferable stability such that the multilayer unit C1 is more preferably and fixingly disposed in the compartment P, reducing the problem of gaps or other structural disintegration in the electric circuit created when the ambience temperature changes due to difference between the coefficients of thermal expansion of the multilayer unit C1 and the polyimide layer PI. The electric circuit E1' and the multilayer unit C1' can be inferred analogously and are not further described.

Preferably, the material of the substrate 10 is polyimide, polyester, polyethylene terephthalate polyester (PET), polyethylene naphthalate (PEN), polytetrafluoroethylene (PTFE), thermotropic liquid crystal polymer (LCP), epoxy resin or aramid. The first electrically conducting layer 30 has a thickness of 50 to 180 nanometers and is an electroless plating layer made of a material selected from the group consisting of nickel, chromium, cobalt, nickel alloy and cobalt alloy. Preferably, the surface 11 of the substrate 10 includes an upper surface 111 and a lower surface 112. The compartment P can be positioned on the upper surface 111 and the lower surface 112. A via hole can vertically pass through the substrate 10, connecting the compartment P on the upper surface 111 and the compartment on the lower surface 111. The adhesion enhancing layer 20 and the first electrically conducting layer 30 of the multilayer unit C1 extend from the bottom wall P12 to the tunnel wall 121 of the via hole 12, through which configuration the second electrically conducting layer 40 extends to the via hole 12, electrically connecting the multilayer unit C1 of the upper surface 111 and the multilayer unit C1 of the lower surface 112.

It is worth mentioning that the method of producing the flexible circuit board of the present disclosure can repeat steps S101 to S119 shown in FIG. 1, to further produce a multilayered flexible circuit board having the structural features of the flexible circuit board 100 of the previous embodiment or of FIG. 2H, specifically the feature of the laterally successively laterally layered electric circuit E1 of the multilayer unit C1 formed sequentially by the adhesion enhancing layer 20, the first electrically conducting layer 30 and the second electrically conducting 40 on the side wall P11 (as shown in FIG. 2H). In other words, the palladium adhesion enhancer of the adhesion enhancing layer 20 can be disposed on two sides of the electric circuit E1 of the compartment P. Therefore, as shown in FIGS. 4B and 4C, the flexible circuit board 100 can repeat the aforementioned steps to form a multi-layered flexible circuit board 200, whose production method is not further detailed.

Figure 4A:
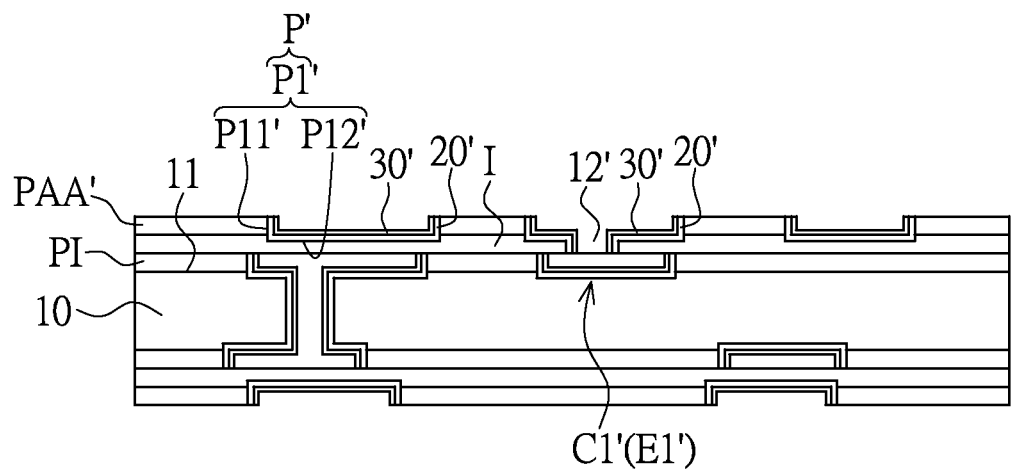
FIG. 4A to FIG. 4D are cross-sectional views corresponding to the production steps of the multilayered flexible circuit board according to the present disclosure.
Figure 4B:
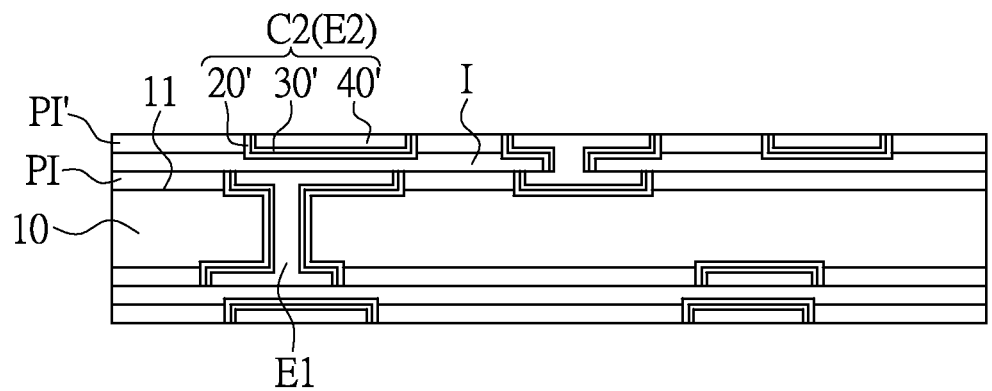
Figure 4C:
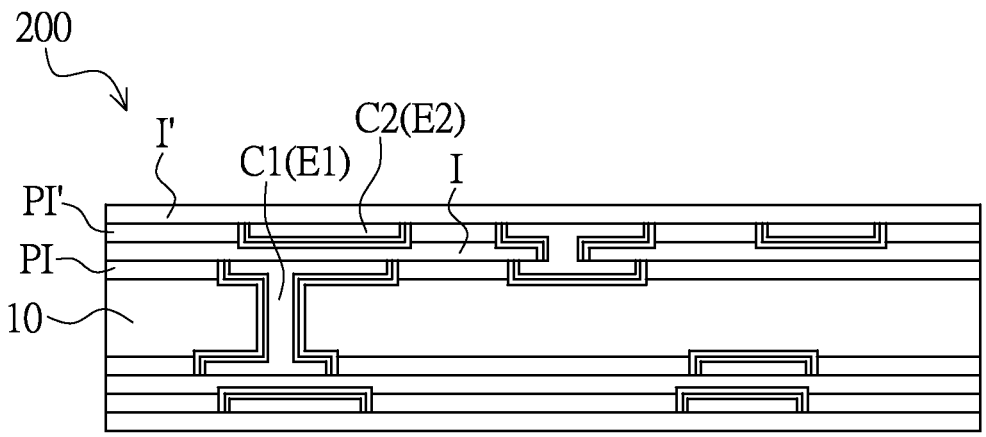

Referring to FIGS. 4A, 4B and 4C, the flexible circuit board 100 of FIG. 2H repeats the steps of FIG. 1 and the conductivity treatment to form a multi-layered circuit board 200 having at least one electrically insulating layer I. The material of the electrically insulating layer I can be the same as the material of the substrate 10. One side of the electrically insulating layer I covers the electric circuit E1 and the polyimide layer PI on the surface 11 of the substrate, and the other side of the electrically insulating layer I is coated with a second polyimide layer PI' whose top surface is partially recessed to define at least a second compartment P'. The second compartment P' likewise has a second inner wall surface P1' including a second side wall P11' and a second bottom wall P12'. The second compartment P' accommodates a second multi-layered unit C2 including at least a second adhesion enhancing layer 20', an additional first electrically conducting layer 30' and an additional second electrically conducting layer 40'. The second adhesion enhancing layer 20' is disposed at least on the inner wall surface P1' of the second compartment P'. The first electrically conducting layer 30' adheres to the second adhesion layer 20'. The second electrically conducting layer 40' is formed on the surface of the first electrically conducting layer 30'. The second adhesion enhancing layer 20' on the second side wall P11' sequentially forms with the first electrically conducting layer 30' and the second electrically conducting layer 40' a successively laterally layered structure, and the second multi-layered unit C2 forms an additional electric circuit E2.

Figure 4D:
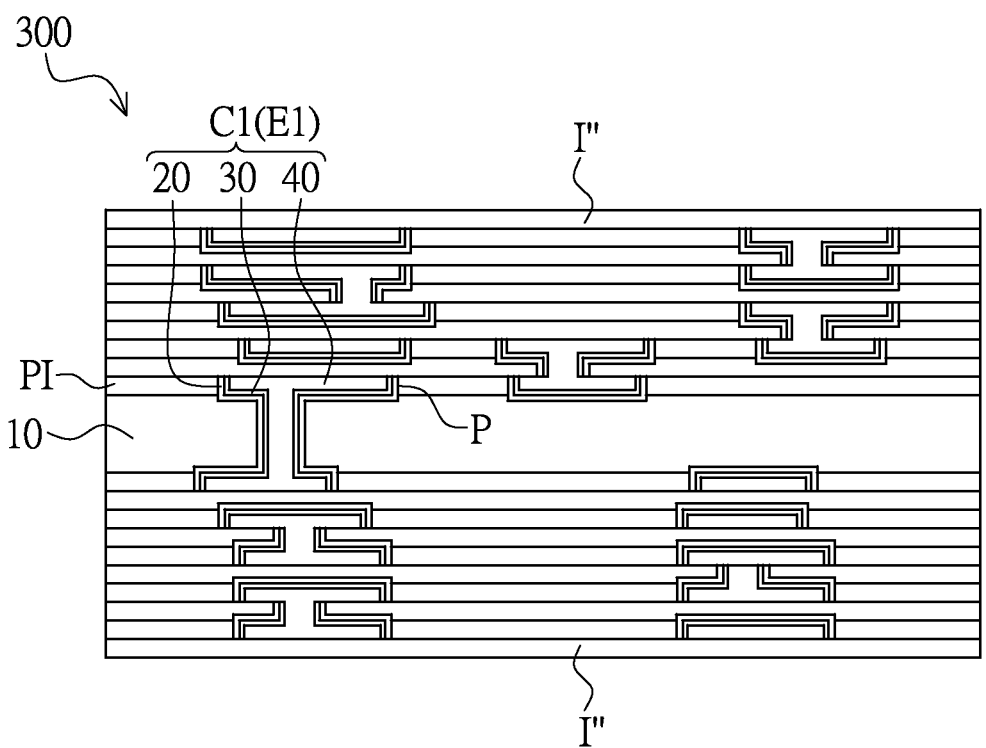

Referring to FIG. 4C, the multi-layered flexible circuit board 200 is a flexible circuit board having two layers of electric circuits (such as electric circuit E1) on the upper surface 111 and the lower surface 112. Additionally, add the electric circuit E2 on the electric circuit E1. Regarding FIG. 4C, the electrically insulating layer I separates the electric circuit E1 and the electric circuit E2. If necessary, a via hole (not shown) may be bore through the electrically insulating layer I to connect the electric circuit E1 and the electric circuit E2. Counting the electric circuit (not labeled) below the substrate 10, then FIG. 4C shows a multi-layered flexible circuit board 200 having 4 layers of electric circuits (2+1+1). FIG. 4D shows a multi-layered flexible circuit board 300 having 10 layers of electric circuits (2+4+4), whose outermost coating layer is an electrically insulating layer I".

Referring to FIG. 2F and FIG. 2G, the present disclosure further provides a precursor substrate 10a including a substrate 10 whose surface is formed with a polyimide layer PI, wherein the polyimide layer is depressed and defines at least one compartment P, the compartment P has an inner wall surface P1 having a side wall P11 and a bottom wall P12, the compartment accommodates a multilayer unit (such as C1 or C1') such as the multilayer unit C1 including at least an adhesion enhancing layer 20 positioned on at least the inner wall surface P1 of the compartment P, and a first electrically conducting unit 30. Therefore, the adhesion enhancing layer 20 is positioned on the side wall P11 of the compartment P. The first electrically conducting layer 30 adheres to the adhesion enhancing layer 20.

The material of the substrate 10 is at least one material selected from the group consisting of polyimide (PI), poly- ethylene terephthalate polyester (PET), polyethylene naphthalate (PEN), polytetrafluorethylene (PTFE), thermotropic liquid crystal polymer (LCP), epoxy, and aramid. The first electrical conducting layer 30 has a thickness of 50 to 200 nanometers and is an electroless plating layer made of a material selected from the group consisting of copper, nickel, chromium, cobalt, nickel alloy and cobalt alloy. The adhesion enhancing layer 20 includes a palladium adhesion enhancer.

Regarding the precursor substrate 10a, the second electrically conducting layer 40 is not required and can be replaced by the first electrically conducting layer 30. In other words, the thickness of the first electrically conducting layer 30 can be increased according to needs so that the first electrically conducting layer 30 can be coated on the surface of the polyimide PI of the precursor substrate 10a and the compartment P defined by the recess, or even completely filling the compartment P. As such, the precursor substrate 10a facilitates subsequent processes performed by downstream technicians during production.

Additionally, by the same logic, referring to FIGS. 2A and 2E, the precursor substrate 10a includes a via hole 12 connecting compartment P of the upper surface 111 and the compartment (not labeled) of the lower surface 112. The first electrically conducting layer 30 can extend to the via hole 12 or completely fill up the via hole.

In summary, the production method of the present disclosure effectively prevents material waste and provides an adhesion enhancing layer (e.g. palladium) on two sides of the electric circuit of the flexible circuit board. The stability of the first electrically conducting layer (e.g. nickel) is important to the transmission quality and life span of the product. Additionally, the present disclosure reduces thickness and achieves the effect of controlling source material and reducing cost.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A method of manufacturing a flexible circuit board, comprising:
   providing a substrate made of polyimide having an upper surface and a lower surface;
   forming a polyamic acid layer on the surface of the substrate, and conducting a first pre-curing process on the polyamic acid layer such that the polyamic acid layer is semi-cured;
   depositing a photoresist on the polyamic acid layer, and conducting a second pre-curing process on the photoresist and the polyamic acid layer;
   exposing and developing the photoresist according to a circuit configuration diagram to partially remove the photoresist and the polyamic acid layer thereunder, partially revealing the surface of the substrate and leaving a remaining photoresist and a remaining polyamic acid layer thereunder, wherein the remaining polyamic acid layer and the remaining photoresist jointly defines a compartment having an inner wall surface including at least a side wall and a bottom wall;
   curing the polyamic acid layer which becomes a polyimide layer, forming a precursor substrate;
   using a basic agent with a pH value between 11 and 12 to treat the bottom wall of the substrate for the side wall of the polyimide layer to include a chemical group O=C— N—C=O and one carbon-nitrogen bond of the chemical group is cleaved, forming a ring-opened polyimide with a carboxyl group in the substrate;

forming a palladium adhesion enhancing layer on the side wall and the bottom wall by using a palladium adhesion enhancer, wherein the palladium adhesion enhancer of the palladium adhesion enhancing layer is chemically bonded with carboxyl group of the ring-opened polyimide;

forming a first electrically conducting layer on the palladium adhesion enhancing layer to fix the first electrically conducting layer on the bottom wall and the side wall;

removing the remaining photoresist and revealing the polyamic acid layer thereunder;

plating a second electrically conducting layer on the surface of the precursor substrate, selectively forming an electric circuit with the first electrically conducting layer and the palladium adhesion enhancing layer in the compartment of the precursor substrate; and forming an electrically insulating layer on the surface of the precursor substrate to cover the electric circuit and the polyimide on the surface of the precursor substrate.

2. The method of manufacturing a flexible circuit board according to claim 1, wherein the step of adhesively enhancing the side wall and the bottom wall by using an adhesive enhancer includes a conductivity treatment including at least a surface roughening process and a reduction process on the bottom wall and the side wall.

3. The method of manufacturing a flexible circuit board according to claim 2, wherein the roughening process on the side wall and the bottom wall is chemical roughening and the chemical roughening includes using chemical agent on the side wall and the bottom wall to roughen by corrosion or ring-opening reactions.

4. The method of manufacturing a flexible circuit board according to claim 2, wherein the roughening process on the side wall and the bottom wall is physical roughening, and the physical roughening includes roughening the side wall and the bottom wall by mechanical means.

5. The method of manufacturing a flexible circuit board according to claim 3, wherein prior to the step of adhesively enhancing the side wall and the bottom wall by using an adhesive enhancer, a via hole is bored through the bottom wall connecting the upper surface and the bottom surface, the via hole connects a compartment on the upper surface and a compartment of the lower surface, the via hole has a tunnel wall, and the electric circuit in the compartment on the upper surface is electrically connected to the electric circuit in the compartment on the lower surface.

6. The method of manufacturing a flexible circuit board according to claim 1, wherein the exposing and developing step further includes using a developing solution selected from the group consisting of tetramethylammonium hydroxide and sodium carbonate.

7. A flexible circuit board, comprising:

a substrate having a surface formed with a polyimide layer, wherein the polyimide layer is recessed and defines at least one compartment, the compartment has an inner wall surface including a side wall and a bottom wall, wherein the side wall of the polyimide layer includes a chemical group O=C—N—C=O and one carbon-nitrogen bond of the chemical group is cleaved, forming a ring-opened polyimide with a carboxyl group in the substrate, wherein the compartment accommodates a multilayer unit at least including:

a palladium adhesion enhancing layer disposed at least on the inner wall surface of the compartment, wherein a palladium adhesion enhancer of the palladium adhesion enhancing layer is chemically bonded with carboxyl group of the ring-opened polyimide;

a first electrically conducting layer adhered onto the palladium adhesion enhancing layer; and a second electrically conducting layer formed on the first electrically conducting layer, wherein the palladium adhesion enhancing layer on the side wall sequentially forms with the first electrically conducting layer and the second electrically conducting layer a successively laterally layered structure, and the multilayer unit forms an electric circuit.

8. The flexible circuit board according to claim 7, wherein the substrate is made of at least one material selected from the group consisting of polyimide, polyethylene terephthalate polyester, polyethylene naphthalate, polytetrafluoroethylene, thermotropic liquid crystal polymer, epoxy resin and aramid.

9. The flexible circuit board according to claim 7, wherein the first electrically conducting layer has a thickness of 50 to 5000 nanometers, and the first electrical conducting layer is an electroless plating layer made of a material selected from the group consisting of copper, nickel, chromium, cobalt, nickel alloy and cobalt alloy.

10. The flexible circuit board according to claim 7, wherein the surface of the substrate includes an upper surface and a lower surface, the compartment is positioned on the upper surface and the lower surface, the substrate has a via hole connecting the upper surface and the lower surface, the via hole has a tunnel wall, the palladium adhesion enhancing layer and the first electrically conducting layer of the multilayer unit are disposed on and extend from the bottom wall to the tunnel wall, and the second electrically conducting layer extend into the via hole electrically connecting the multilayer unit on the upper surface and the multiplayer unit on the lower surface.

11. The flexible circuit board according to claim 7, wherein the flexible circuit board is a multilayer flexible circuit board including at least one electrically insulating layer, one side of the electrically insulating layer covers the electric circuit and the polyimide layer in the compartment of the substrate, the other side of the electrically insulating layer is coated with a second polyimide layer, the polyimide layer is recessed and defines at least a second compartment, the second compartment has a second inner wall surface including a second side wall and a second bottom wall, and the second compartment accommodates a second multilayer unit including at least:

a second adhesion enhancing layer disposed at least on the inner wall surface of the second compartment;

an additional first electrically conducting layer adhered onto the second adhesion enhancing layer; and an additional second electrically conducting layer formed on the additional first electrically conducting layer, wherein the second adhesion enhancing layer on the second side wall sequentially forms with the additional first electrically conducting layer and the additional second electrically conducting layer a successively laterally layered structure, the second multilayer unit forms an additional electric circuit.

12. The flexible circuit board according to claim 7, wherein the polyimide layer is a remaining polyimide layer formed by being coated with a photoresist, exposed, developed and cured, and the compartment is defined by the remaining polyimide layer.

13. A precursor substrate, comprising:

a substrate having a surface formed with a polyimide layer, wherein the polyimide layer is recessed and defines at least one compartment, the compartment has an inner wall surface including a side wall and a bottom wall, wherein the side wall of the polyimide layer includes a chemical group O=C—N—C=O and one carbon-nitrogen bond of the chemical group is cleaved, forming a ring-opened polyimide with a carboxyl group in the substrate, wherein the compartment accommodates a multilayer unit including:

a palladium adhesion enhancing layer disposed at least on the inner wall surface of the compartment, wherein a palladium adhesion enhancer of the palladium adhesion enhancing layer is chemically bonded with carboxyl group of the ring-opened polyimide; and a first electrically conducting layer adhered onto the palladium adhesion enhancing layer.

14. The precursor substrate according to claim 13, wherein the substrate is made of at least one material selected from the group consisting of polyimide, polyethylene terephthalate polyester, polyethylene naphthalate, polytetrafluoroethylene, thermotropic liquid crystal polymer, epoxy resin and aramid.

15. The precursor substrate according to claim 13, wherein the first electrically conducting layer has a thickness of 50 to 5000 nanometers, and the first electrically conducting layer is an electroless plating layer made of a material selected from the group consisting of copper, nickel, chromium, cobalt, nickel alloy and cobalt alloy.

* * * * *